United States Patent [19]

Gressitt et al.

[11] 4,149,028
[45] Apr. 10, 1979

[54] CUSTOMER SERVICE CLOSURES

[75] Inventors: Tillman J. Gressitt, Long Valley; Arnold R. Smith, Chester, both of N.J.

[73] Assignee: Bell Telephone Laboratories, Incorporated, Murray Hill, N.J.

[21] Appl. No.: 789,740

[22] Filed: Apr. 21, 1977

[51] Int. Cl.² .................. H05K 5/00; H05K 5/02; H05K 5/03
[52] U.S. Cl. .................. 174/65 R; 174/52 R; 174/81; 248/214; 248/218.4
[58] Field of Search .................. 174/48, 49, 65, 59, 174/60, 52 R, 50, 81, 58; 248/214, 218.4–219.4, 225.3, 207, 343

[56] References Cited

U.S. PATENT DOCUMENTS

| | | | |
|---|---|---|---|
| 1,359,143 | 11/1920 | Amos | 174/59 |
| 1,822,879 | 9/1931 | Brachtl | 174/81 |
| 3,003,019 | 10/1961 | Dearle | 174/66 X |
| 3,138,654 | 6/1964 | Pomanek | 174/61 |
| 3,175,031 | 3/1965 | Reiner | 174/58 X |
| 3,310,712 | 3/1967 | Paddock | 361/357 |
| 3,328,513 | 6/1967 | Goldsobel | 174/81 |
| 3,347,505 | 10/1967 | Menser | 248/218.4 X |
| 3,467,762 | 9/1969 | Boudouris | 174/52 R |
| 3,873,757 | 3/1975 | Berke et al. | 174/52 R |

Primary Examiner—J. V. Truhe
Assistant Examiner—D. A. Tone
Attorney, Agent, or Firm—John W. Fisher

[57] ABSTRACT

A customer service closure includes a base having a plurality of indentations on one side for facilitating the mounting of a variety of communications apparatus such as protective devices. On an opposite side of the base there is provision for mounting the closure on a number of structures such as walls, horizontal and vertical conduits, pedestals, and mounting posts. Protection against environmental contaminants is provided by a cover which is slidably engageable with the base. The cover and base further include provisions for securing them to one another to prevent unauthorized entry.

20 Claims, 6 Drawing Figures

CUSTOMER SERVICE CLOSURES

BACKGROUND OF THE INVENTION

1. Field of the Invention

This invention relates to apparatus for housing a variety of communications apparatus and, in particular, to a closure which can be mounted in a variety of ways at a customer's premises.

2. Description of the Prior Art

In providing communications services to a customer, devices are employed at the customer's premises to provide protection against lightning, power surges, and the like. Typically, these devices have been mounted inside the customer's premises. One problem has been gaining access to the premises to replace fused devices. In some instances other problems have arisen in attempting to mount such devices in mobile homes. Consequently, there is a need for a closure which can be used to house protection devices and the like outside a customer's premises. Such a closure should also be capable of providing protection against environmental contamination.

Housings of the type disclosed in L. R. Berke et al U.S. Pat. No. 3,873,757, issued Mar. 25, 1975, and A. F. Paddock U.S. Pat. No. 3,310,712, issued Mar. 21, 1967, provide protection from environmental contaminants, but these closures are not suited for mounting on a variety of different surfaces such as horizontal and vertical power conduits and mounting posts. Other closures, such as the one shown in A. T. Pomanek U.S. Pat. No. 3,138,654, issued June 23, 1964, are mountable on a pipe. However, this apparatus is incapable of being readily attached to a pipe or a conduit already in place and having no free end available.

Accordingly, it is one object of the present invention to facilitate mounting of a customer service closure on a variety of surfaces such as walls, horizontal and vertical conduits, pedestals, mounting posts, and the like.

Another object is to configure a closure which can accept a variety of different communication devices such as protectors, filters, ringer isolators, and the like.

A further object of the present invention is to have the capability for rigidly coupling the closure to a conduit carrying a service wire.

Yet another object is to facilitate sealing of the closure once the communication devices are installed and the service wires are terminated.

Still a further object of the present invention is to configure a closure which can be advantageously secured to prevent unauthorized entry.

SUMMARY OF THE INVENTION

The foregoing and other objects of the invention are realized in an illustrative embodiment of a closure which includes an insulative base having a plurality of indentations therein on one side for accepting mounting hardware to secure a variety of communications apparatus to the base. On an opposite side of the base there is integrally included apparatus for supporting the base on a variety of mountings such as walls, horizontal and vertical conduits, pedestals, and mounting posts. A cover, slidably engageable with the base, includes provision for securing it to the base to prevent unauthorized entry into the closure.

Accordingly, it is one feature of the present invention that the base has provision on its back side to facilitate its mounting on a variety of different surfaces.

Another feature is that the base has provision thereon for effecting a rigid coupling between the base and a conduit.

A further feature of the present invention is that the front side of the base has a plurality of indentations therein to facilitate the mounting of a variety of communications apparatus such as protectors, filters, ringer isolators, and the like.

Still another feature is the provision of a cover which slidably engages the base for ease of authorized entry.

Yet a further feature of the present invention is that the cover and base can be advantageously secured to one another to reduce the possibility of unauthorized entry.

BRIEF DESCRIPTION OF THE DRAWINGS

The aforementioned objects and features of the invention, as well as other objects and features, will be better understood upon a consideration of the following detailed description and the appended claims taken in conjunction with the attached drawings of an illustrative embodiment in which:

DETAILED DESCRIPTION

Figure 1:
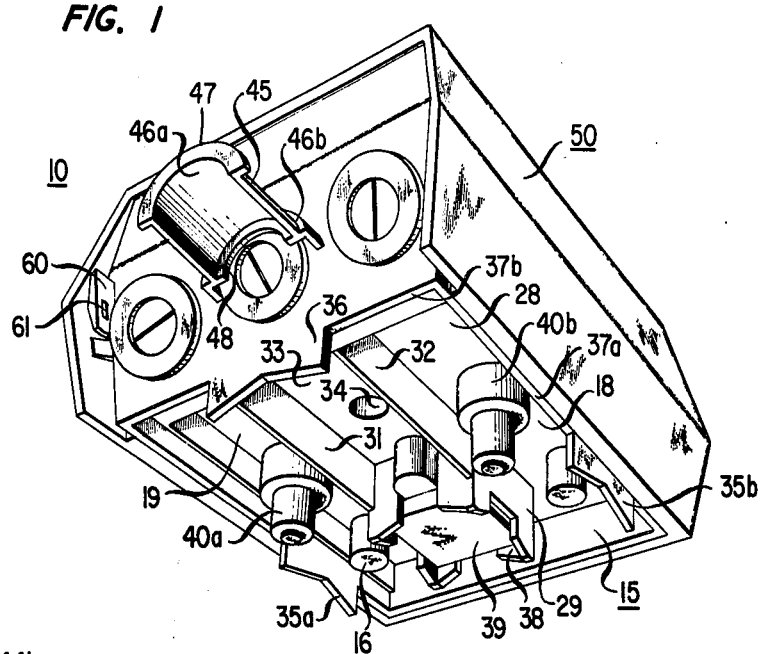
FIG. 1 is a perspective view of a customer service closure illustrating the provision for facilitating the mounting of the closure to a variety of surfaces.
Figure 2:
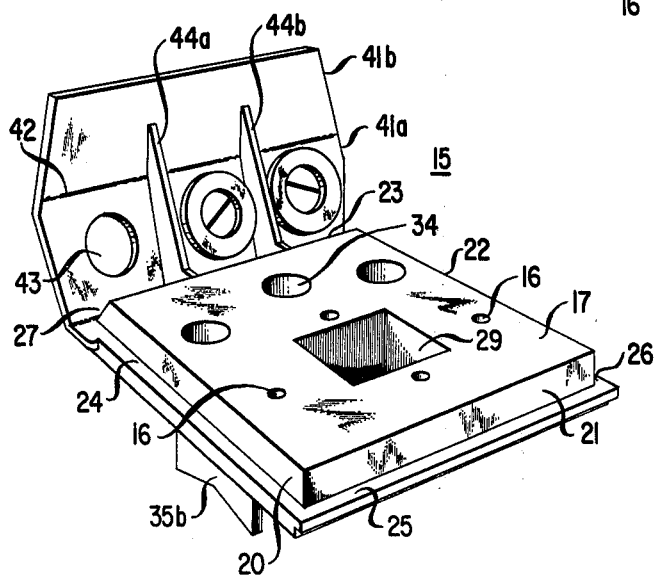
FIG. 2 illustrates a base having provision therein for facilitating the mounting of a variety of communications apparatus.

A closure 10 for housing communications apparatus, such as a protector similar to that shown in A. F. Paddock U.S. Pat. No. 3,310,712, issued Mar. 21, 1967, is shown in FIG. 1. Closure 10 includes an insulative base 15 and an insulative cover 50. Base 15, as shown in FIG. 2, has a plurality of indentations 16 on its front side 17. Indentations 16 accept mounting hardware (not shown) to secure the communications apparatus to base 15.

Base 15 is comprised of a rectangular-shaped panel 19 and sidewalls 20 through 22 which are integral with panel 19 and extend generally perpendicular thereto. A fourth sidewall 23, also integral with panel 19, extends outwardly away from panel 19 at an angle between 15 and 75 degrees. Extending generally perpendicular to sidewalls 20 through 23 are a number of outwardly directed shoulders 24 through 27. Shoulders 24 through 27 all lie in a common plane parallel with but spaced apart from a plane containing rectangular-shaped panel 19. The function of these shoulders will become evident subsequently. Sidewalls 20 through 23, in conjunction with panel 19, form a cavity 28 on back side 18 of base 15 in which the plurality of indentations 16 are confined.

Base 15 further includes a generally square-shaped projection 29. This projection, along with support ribs 31 and 32 and fourth sidewall 23, define a chamber 33 which has a generally circular aperture 34 therethrough. Chamber 33 provides support and isolation for a wire (not shown) when it is routed out of closure 10 into a subscriber's premises.

Included on back side 18 of base 15 are provisions for supporting the base on a variety of mountings including walls, horizontal and vertical conduits, pedestals, and mounting posts. The support structure comprises a plurality of M-shaped projections 35a and 35b, and 36. Projections 35a and 35b are integral with and extend outwardly from parallel outer edges 37a and are aligned with one another so as to intersect a first axis which passes through their midpoints. Projections 36 is integral with and extends outwardly from outer edge 37b which is directed oppositely to outer edges 37a. Projection 36 perpendicularly intersects a second axis passing through its midpoint. The two axes just defined are generally perpendicular to one another and intersect in a central region 39 of square-shaped projection 29.

About each corner of square-shaped projection 29 is a generally tapered V-shaped projection 38. Depending upon the orientation of the conduit to which closure 10 is to be affixed, appropriate M-shaped projections 35 or 36 are utilized. For example, to support closure 10 on horizontal conduit, M-shaped projections 35 and tapered V-shaped projections 38 are employed. Should it be necessary to support closure 10 on vertical conduit, M-shaped projection 36 and tapered V-shaped projections 38 are utilized.

It should be noted that square-shaped projection 29 in regions between V-shaped projections 38 is constructed to advantageously permit the insertion of a tool such as a screwdriver (not shown) through these regions to remove a portion of the material. Removal of this material facilitates the fastening of closure 10 to either horizontal or vertical conduits by threading a suitable clamping device (not shown) through one region then around the conduit through another region and back to front side 17 of base 15.

An alternate means of support for base 15 facilitates its mounting on a flat surface, such as might be encountered with walls, pedestals, and mounting posts. This support configuration includes M-shaped projections 35 and 36 in conjunction with cylindrical projections 40a and 40b. Projections 40a and 40b are integral with and extend outwardly from an intermediate region of base 15 and have a height approximately equal to the height of tip regions of M-shaped projections 35 and 36.

To facilitate the routing of service wires into closure 10, base 15 has a generally perpendicular projection 41 at one end. Projection 41 includes a pair of trapezoidal panels 41a and 41b which are integral with one another along a trapezoid base dimension 42 of greatest extent. Included in panel 41a are a number of apertures 43. Separation between apertures 43, as well as structural support, is provided by wedge-shaped ribs 44a and 44b.

One problem often encountered in prior art closures is wire abrasion caused by relative motion between the closure and the conduit. To alleviate this problem base 15 includes provision for coupling it to a conduit. This function is provided by a generally semicircular member 45 which extends outwardly away from projection 41. Member 45 includes a first curved member 46a which approximates a segment of a sidewall of a right circular cylinder. At one end of first curved member 46a is an outwardly directed raised lip 47. At an opposite end of curved member 46a there is a second curved member 46b which also approximates a segment of a sidewall of a right circular cylinder. The diameter of the cylindrical segment defining curved member 46b is greater than the diameter defining the cylindrical segment comprising curved member 46a.

Figure 6:
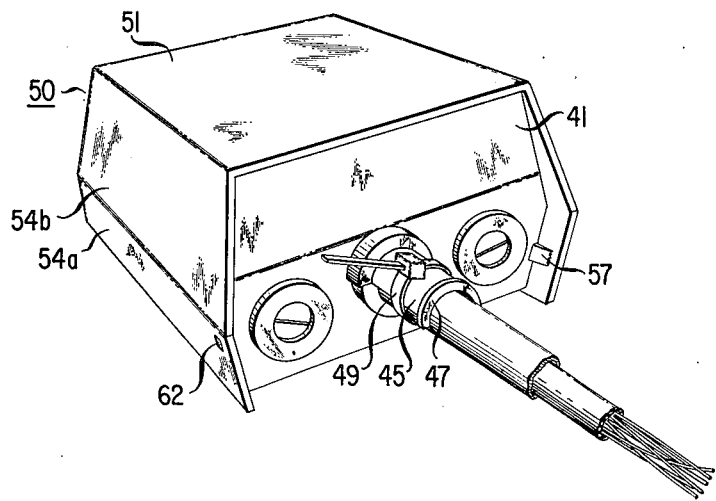
FIG. 6 shows a closure mounted on a wall with conduit coupled to the closure.

On an opposite side of the junction point between curved members 46a and 46b there is a second raised lip 48. Lip 48 limits the extent that conduit can be brought into engagement with member 45. As shown in FIG. 6, a clamp 49 holds first curved member 46a juxtaposed the conduit. Clamp 49 is maintained in position by lip 47 and curved member 46b.

Figure 3:
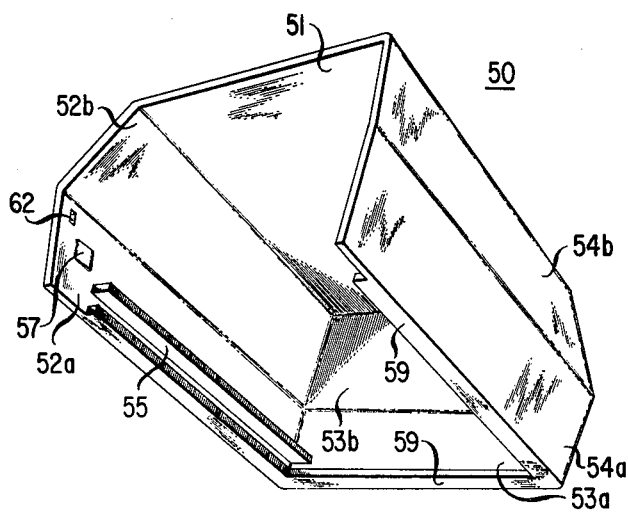
FIG. 3 illustrates a cover slidably engageable with the base and having provision therein for securing it to the base.

Once base 15 is mounted, the communications apparatus installed, and the wired connections completed, the entire assembly is enclosed by cover 50. To facilitate authorized entry into closure 10, cover 50, as shown in FIG. 3, is configured so as to be slidably engageable with base 15. Cover 50 includes front panel 51 and sidewalls 52 through 54. Each of sidewalls 52 through 54 are integral with panel 51. Moreover, to obtain additional structural strength, each of sidewalls 52 through 54 is comprised of a pair of trapezoidal-shaped panels such as, for example, 52a and 52b. Trapezoidal-shaped panels 52a and 52b are integral with each other along a trapezoid base dimension of the greater extent.

On the inside of sidewalls 52 and 54 are slideways 55. Slideways 55 slidably engage shoulders 24 and 26 whose function, as noted previously, was to be made apparent. Near the ends of sidewalls 52 and 54, opposite sidewalls 53, are barbed projections 57. Around the edges of sidewalls 52 through 54 are inwardly directed extensions 59. Extensions 59 all lie in a common plane which is parallel with but spaced apart from a plane containing front panel 51. The extensions 59 engage edges 37a of base 15 while the barbed projections 57 engage trapezoidal-shaped panel 41a to hold cover 50 in engagement with base 15.

To secure closure 10 against unauthorized entry, base 15 has a tab-like extension 60 integral with and extending outwardly from an edge of trapezoidal-shaped panel 41a. Tab-like extension 60 has a generally rectangular-shaped aperture 61 therein which is positioned juxtaposed a mating aperture 62 in sidewalls 52 of cover 50. A suitable fastener 63 is inserted through apertures 61 and 62 to fasten cover 50 to base 15.

Figure 4:
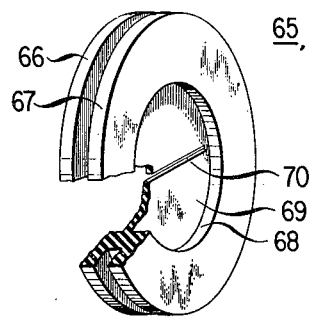
FIG. 4 illustrates a gasket for sealing entry apertures in the base.

To seal closure 10 against environmental contaminants, wire entry apertures 43 and wire exit aperture 34 are closed with gaskets 65, such as those shown in FIG. 4. Gaskets 65 are comprised of a generally flexible material. To obtain a relatively efficient seal around the edges of apertures 43 and 34, each of gaskets 65 includes first and second spaced-apart annular lips 66 and 67. These lips are joined together by a generally circular sidewall 68 at an inner diameter of lips 66 and 67. A flexible membrane 69 extends inwardly of sidewall 68 to form a seal over the area enclosed within the inner diameter of lips 66 and 67.

Figure 5:
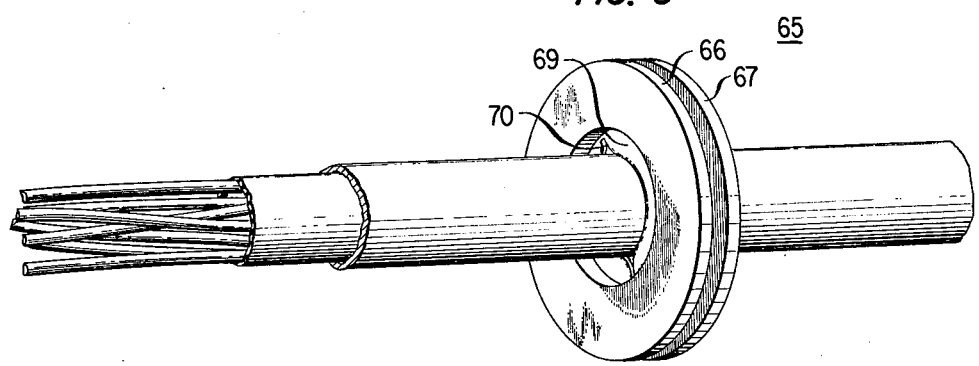
FIG. 5 shows the seal about a wire effected by the gasket of FIG. 4.

To facilitate routing a wire into closure 10 while gaskets 65 remain in place, membrane 69 has a pair of diametrically directed depressions 70 on opposite sides thereof. Depressions 70 lie in a common plane which is perpendicular to a pair of parallel planes containing lips 66 and 67. As shown in FIG. 5, as a wire engages membrane 69, depressions 70 are ruptured a partial distance along their length and membrane 69 flexes to permit passage of the wire while maintaining a sealed encirclement of the wire.

In all cases it is to be understood that the above-described embodiment is illustrative of but a small number of many possible specific embodiments which can represent applications of the principles of the invention.

Thus, numerous and various embodiments can readily be devised in accordance with these principles by those skilled in the art without departing from the spirit and scope of the invention.

What is claimed is:

1. A closure for housing at least one of a variety of communications apparatus including:
   an insulative base having a plurality of indentations therein on one side for accepting mounting hardware to secure said communications apparatus to said base;
   means on an opposite side of said base for supporting said base on a variety of mountings including walls, horizontal and vertical conduits, pedestals, and mounting posts, said supporting means including
   a plurality of generally M-shaped projections integral with and extending outwardly from outer edges of said opposite side of said base, and
   a plurality of generally cylindrical projections integral with and extending outwardly from an intermediate region of said base, said cylindrical projections having a height approximately equal to a height of tip regions of said M-shaped projections so that said base is mountable upon a flat surface; and
   a cover slidably engaged with said base.

2. The closure in accordance with claim 1 wherein said base includes:
   a generally rectangular-shaped panel;
   first, second and third sidewalls integral with and extending generally perpendicular to said panel;
   first, second and third outwardly directed shoulders integral with and extending generally perpendicular to said first, second and third sidewalls, respectively, said shoulders lying in a common plane parallel with but spaced apart from a plane containing said rectangular-shaped panel;
   a fourth sidewall integral with and extending outwardly away from said rectangular-shaped panel at a predetermined angle; and
   a fourth shoulder integral with said fourth sidewall and said first and third shoulders, said fourth shoulder lying in said common plane.

3. The closure in accordance with claim 2 wherein said base further includes:
   a generally square-shaped projection in an intermediate region of said opposite side of said base;
   first and second support ribs integral with said rectangular-shaped panel and said fourth sidewall, said support ribs, panel and fourth sidewall defining a chamber having a generally circular aperture therethrough; and
   a gasket of flexible material mounted in said aperture.

4. The closure in accordance with claim 3 wherein said gasket includes:
   first and second spaced-apart annular lips;
   a generally circular sidewall interconnecting said lips at an inner diameter thereof; and
   a flexible membrane extending inwardly of said sidewall to form a seal over an area enclosed within said inner diameter, said membrane having a pair of diametrically directed depressions therein on opposite sides, said depressions lying in a common plane perpendicularly intersecting said membrane so that a wire routed out of said closure through said gasket ruptures said depressions partially along their length and is sealingly encircled by said membrane to prevent entry of environmental contaminants into said closure.

5. The closure in accordance with claim 1 further including:
   means, extending outwardly from and generally perpendicular to said base, for routing wires into said closure; and
   means, integral with said routing means, for coupling said base to a conduit.

6. The closure in accordance with claim 5 wherein said routing means includes:
   first and second trapezoidal-shaped panels integral with each other along a trapezoid base dimension of greater extent, said first trapezoidal-shaped panel having a plurality of generally circular apertures therethrough;
   a plurality of wedge-shaped ribs, integral with said first and second panels and said base, said ribs providing structural support and separating said plurality of apertures from one another; and
   a plurality of gaskets of flexible material mounted in said apertures, one such gasket for each aperture.

7. The closure in accordance with claim 6 wherein each of said gaskets includes:
   first and second spaced-apart annular lips;
   a generally circular sidewall interconnecting said lips at an inner diameter thereof; and
   a flexible membrane extending inwardly of said sidewall to form a seal over an area enclosed within said inner diameter, said membrane having a pair of diametrically directed depressions therein on opposite sides, said depressions lying in a common plane perpendicular to a pair of parallel planes containing said first and second lips, respectively, so that a wire routed into said closure ruptures said depressions partially along their length and is sealingly encircled by said membrane.

8. The closure in accordance with claim 5 wherein said conduit coupling means integral with said routing means includes:
   a first curved member approximating a segment of a sidewall of a right circular cylinder of a first diameter;
   a first raised lip integral with an outer edge of one end of said first curved member;
   a second curved member approximating a segment of a sidewall of a right circular cylinder of a second diameter, said second diameter being greater than said first diameter, said first and second curved members being integrally joined at an end of said first curved member opposite that having said first raised lip;
   a second raised lip integral with an inner edge of the junction of said first and second curved members, said lip limiting the extent of conduit coupling to said base; and
   means for holding said first curved member juxtaposed said conduit, said holding means confined between said first raised lip and said second curved member.

9. The closure in accordance with claim 5 wherein said cover includes:
   a front panel;
   first, second and third sidewalls integral with said panel, each of said sidewalls comprised of first and second trapezoidal-shaped panels integral with each other along a trapezoid base dimension of greater extent;

first and second slideways integral with said first and third sidewalls, respectively, said slideways engaging said base as said base and cover are brought into slidable engagement with one another;

first and second barbed projections integral with said first and third sidewalls, respectively;

inwardly directed extensions integral with edges of said first, second and third sidewalls, said extensions lying in a common plane parallel with and spaced apart from a plane containing said front panel, said extensions engaging edges of said base and said barbed projections engaging said routing means to hold said cover in engagement with said base; and means for securing said cover to said base.

10. The closure in accordance with claim 9 wherein said securing means includes:

a tab-like extension integral with and extending perpendicularly outwardly from an edge of said routing means, said extension having an aperture therein which aperture is juxtaposed a mating aperture in said first sidewall; and means, threadably insertable through said apertures, for fastening said cover to said base to prevent unauthorized entry into said closure.

11. A closure for housing at least one of a variety of communications apparatus including:

an insulative base having a plurality of indentations therein on one side for accepting mounting hardware to secure said communications apparatus to said base;

means on an opposite side of said base for supporting said base on a variety of mountings including walls, horizontal and vertical conduits, pedestals, and mounting posts, said supporting means including:

a plurality of generally M-shaped projections integral with and extending outwardly from parallel outer edges of said opposite side of said base, each of these said projections aligned with one another so as to intersect a first axis passing through midpoints of said projections;

at least one other generally M-shaped projection integral with and extending outwardly from another outer edge of said opposite side of said base, said other projection perpendicularly intersecting a second axis passing through its midpoint, said first and second axes being generally perpendicular to one another; and a generally square-shaped projection in an intermediate region of said base, said square-shaped projection having generally tapered V-shaped projections at each corner such that a central region of said square-shaped projection is positioned at a point of intersection of said first and second axes to enable engagement of said plurality of M-shaped projections and said tapered V-shaped projections with horizontal conduit and said other M-shaped projection and said tapered V-shaped projections with vertical conduit whichever is to be accommodated; and a cover slidably engaged with said base.

12. The closure in accordance with claim 11 wherein said base includes:

a generally rectangular-shaped panel;

first, second and third sidewalls integral with an extending generally perpendicular to said panel;

first, second and third outwardly directed shoulders integral with and extending generally perpendicular to said first, second and third sidewalls, respectively, said shoulders lying a common plane parallel with but spaced apart from a plane containing said rectangular-shaped panel;

a fourth sidewall integral with and extending outwardly away from said rectangular-shaped panel at a predetermined angle; and a fourth shoulder integral with said fourth sidewall and said first and third shoulders, said fourth shoulder lying in said common plane.

13. The closure in accordance with claim 12 wherein said base further includes:

a generally square-shaped projection in an intermediate region of said opposite side of said base;

first and second support ribs integral with said rectangular-shaped panel and said fourth sidewall, said support ribs, panel, and fourth sidewall defining a chamber having a generally circular aperture therethrough; and a gasket of flexible material mounted in said aperture.

14. The closure in accordance with claim 13 wherein said gasket includes:

first and second spaced-apart annular lips;

a generally circular sidewall interconnecting said lips at an inner diameter thereof; and a flexible membrane extending inwardly of said sidewall to form a seal over an area enclosed within said inner diameter, said membrane having a pair of diametrically directed depressions therein on opposite sides, said depressions lying in a common plane perpendicularly intersecting said membrane so that a wire routed out of said closure through said gasket ruptures said depressions partially along their length and is sealingly encircled by said membrane to prevent entry of environmental contaminants into said closure.

15. The closure in accordance with claim 11 further including:

means, extending outwardly from and generally perpendicular to said base, for routing wires into said closure; and means, integral with said routing means, for coupling said base to a conduit.

16. The closure in accordance with claim 15 wherein said routing means includes:

first and second trapezoidal-shaped panels integral with each other along a trapezoid base dimension of greater extent, said first trapezoidal-shaped panel having a plurality of generally circular apertures therethrough;

a plurality of wedge-shaped ribs, integral with said first and second panels and said base, said ribs providing structural support and separating said plurality of apertures from one another; and a plurality of gaskets of flexible material mounted in said apertures, one such gasket for each aperture.

17. The closure in accordance with claim 16 wherein each of said gaskets includes:

first and second spaced-apart annular lips;

a generally circular sidewall inter-connecting said lips at an inner diameter thereof; and a flexible membrane extending inwardly of said sidewall to form a seal over an area enclosed within said inner diameter, said membrane having a pair of diametrically directed depressions therein on opposite sides, said depressions lying in a common plane perpendicular to a pair of parallel planes containing said first and second lips, respectively, so that a wire routed into said closure ruptures said depressions partially along their length and is sealingly encircled by said membrane.

18. The closure in accordance with claim 15 wherein said conduit coupling means integral with said routing means includes:
- a first curved member approximating a segment of a sidewall of a right circular cylinder of a first diameter;
- a first raised lip integral with an outer edge of one end of said first curved member;
- a second curved member approximating a segment of a sidewall of a right circular cylinder of a second diameter, said second diameter being greater than said first diameter, said first and second curved members being integrally joined at an end of said first curved member opposite that having said first raised lip;
- a second raised lip integral with an inner edge of the junction of said first and second curved members, said lip limiting the extent of conduit coupling to said base; and
- means for holding said first curved member juxtaposed said conduit, said holding means confined between said first raised lip and said second curved member.

19. The closure in accordance with claim 15 wherein said cover includes:
- a front panel;
- first, second and third sidewalls integral with said panel, each of said sidewalls comprised of first and second trapezoidal-shaped panels integral with each other along a trapezoid base dimension of greater extent;
- first and second slideways integral with said first and third sidewalls, respectively, said slideways engaging said base as said base and cover are brought into slidable engagement with one another;
- first and second barbed projections integral with said first and third sidewalls, respectively;
- inwardly directed extensions integral with edges of said first, second and third sidewalls, said extensions lying in a common plane parallel with and spaced apart from a plane containing said front panel, said extensions engaging edges of said base and said barbed projections engaging said routing means to hold said cover in engagement with said base; and
- means for securing said cover to said base.

20. The closure in accordance with claim 19, wherein said securing means includes:
- a tab-like extension integral with and extending perpendicularly outwardly from an edge of said routing means, said extension having an aperture therein which aperture is juxtaposed a mating aperture in said first sidewall; and
- means, threadably insertable through said apertures, for fastening said cover to said base to prevent unauthorized entry into said closure.

* * * * *